US012684831B2

(12) United States Patent
Lo et al.

(10) Patent No.: US 12,684,831 B2
(45) Date of Patent: Jul. 14, 2026

(54) SEMICONDUCTOR DEVICE HAVING A GATE ON A FIN-SHAPED STRUCTURE AND MULTI-LAYER SINGLE DIFFUSION BREAK (SDB) FEATURES

(71) Applicant: UNITED MICROELECTRONICS CORP., Hsin-Chu City (TW)

(72) Inventors: Guang-Yu Lo, New Taipei City (TW); Chun-Tsen Lu, Tainan City (TW); Chung-Fu Chang, Tainan City (TW); Chih-Shan Wu, Tainan City (TW); Yu-Hsiang Lin, New Taipei City (TW); Wei-Hao Chang, Taichung City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 528 days.

(21) Appl. No.: 18/134,555

(22) Filed: Apr. 13, 2023

(65) Prior Publication Data
US 2024/0313046 A1 Sep. 19, 2024

(30) Foreign Application Priority Data
Mar. 15, 2023 (TW) ................................. 112109445

(51) Int. Cl.
*H10D 62/10* (2025.01)
*H10D 30/01* (2025.01)
(Continued)

(52) U.S. Cl.
CPC ......... *H10D 62/115* (2025.01); *H10D 30/024* (2025.01); *H10D 30/605* (2025.01); (Continued)

(58) Field of Classification Search
CPC ........... H10D 84/0158; H10D 84/0193; H10D 84/834; H10D 84/853; H10D 86/011; (Continued)

(56) References Cited

U.S. PATENT DOCUMENTS 7,719,064 B2 5/2010 Wu
10,811,258 B1 * 10/2020 Tsai .................... H01L 21/0337
(Continued)

FOREIGN PATENT DOCUMENTS

TW 201822355 A 6/2018

OTHER PUBLICATIONS

Chen, the specification, including the claims, and drawings in the U.S. Appl. No. 14/583,771, filed Dec. 29, 2014.

*Primary Examiner* — Younes Boulghassoul
(74) *Attorney, Agent, or Firm* — Winston Hsu

(57) ABSTRACT

A method for fabricating a semiconductor device includes the steps of forming a fin-shaped structure on a substrate, forming a first trench and a second trench in the fin-shaped structure, forming a first dielectric layer in the first trench and the second trench, removing part of the first dielectric layer, forming a second dielectric layer in the first trench and the second trench to form a first single diffusion break (SDB) structure and a second SDB structure, and then forming a gate structure on the fin-shaped structure, the first SDB structure, and the second SDB structure.

9 Claims, 8 Drawing Sheets

(51) Int. Cl.

| | |
|---|---|
| *H10D 30/60* | (2025.01) |
| *H10D 30/62* | (2025.01) |
| *H10D 84/01* | (2025.01) |
| *H10W 10/00* | (2026.01) |
| *H10W 10/17* | (2026.01) |

(52) U.S. Cl.
CPC ....... *H10D 30/6211* (2025.01); *H10D 62/116* (2025.01); *H10D 84/0151* (2025.01); *H10D 84/0158* (2025.01); *H10W 10/014* (2026.01); *H10W 10/0143* (2026.01); *H10W 10/17* (2026.01)

(58) Field of Classification Search
CPC ..... H10D 86/215; H10D 30/024–0245; H10D 30/62–6219; H10D 62/115; H10D 62/116; H10D 84/0151; H10D 84/0153; H10D 84/0188; H10D 30/0243; H10B 12/36; H10B 12/056; H01L 21/76224; H01L 21/76229; H01L 21/76232; H10W 10/014; H10W 10/0143; H10W 10/0145; H10W 10/17
See application file for complete search history.

(56) References Cited

U.S. PATENT DOCUMENTS

| | | | | |
|---|---|---|---|---|
| 11,289,572 | B1 * | 3/2022 | Chiu ................... | H10D 30/6211 |
| 2007/0158780 | A1 * | 7/2007 | Chang ............... | H10D 84/0151 |
| | | | | 257/E21.624 |
| 2008/0303968 | A1 * | 12/2008 | Terada .............. | H10D 84/0142 |
| | | | | 438/296 |
| 2017/0110536 | A1 * | 4/2017 | Hsiao ................... | H01L 23/535 |
| 2018/0158902 | A1 * | 6/2018 | Chiu ..................... | H10D 30/62 |
| 2022/0052193 | A1 | 2/2022 | Wang | |
| 2023/0154922 | A1 * | 5/2023 | Yang ................... | H10D 84/0193 |
| | | | | 257/369 |
| 2023/0197523 | A1 * | 6/2023 | Hsu ................... | H10D 84/0142 |
| | | | | 257/392 |
| 2023/0197718 | A1 * | 6/2023 | Hsu ................... | H10D 84/0128 |
| | | | | 257/401 |
| 2023/0253496 | A1 * | 8/2023 | Li .......................... | H10D 30/63 |
| | | | | 257/192 |
| 2023/0268346 | A1 * | 8/2023 | Chiu ................. | H10D 84/0144 |
| | | | | 257/369 |
| 2023/0378167 | A1 * | 11/2023 | Lee ................... | H10D 84/0149 |
| 2024/0204085 | A1 * | 6/2024 | Yang ................. | H10D 30/0243 |

* cited by examiner

SEMICONDUCTOR DEVICE HAVING A GATE ON A FIN-SHAPED STRUCTURE AND MULTI-LAYER SINGLE DIFFUSION BREAK (SDB) FEATURES

BACKGROUND OF THE INVENTION

1. Field of the Invention

The invention relates to a method for fabricating semiconductor device, and more particularly, to a method of forming high-voltage (HV) device on single diffusion break (SDB) structure.

2. Description of the Prior Art

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the fin FET can be controlled by adjusting the work function of the gate.

In current FinFET fabrication, after shallow trench isolation (STI) is formed around the fin-shaped structure part of the fin-shaped structure and part of the STI could be removed to form a trench, and insulating material is deposited into the trench to form single diffusion break (SDB) structure or isolation structure. However, the integration of the SDB structure and metal gate fabrication still remains numerous problems. Hence how to improve the current FinFET fabrication and structure has become an important task in this field.

SUMMARY OF THE INVENTION

According to an embodiment of the present invention, a method for fabricating a semiconductor device includes the steps of forming a fin-shaped structure on a substrate, forming a first trench and a second trench in the fin-shaped structure, forming a first dielectric layer in the first trench and the second trench, removing part of the first dielectric layer, forming a second dielectric layer in the first trench and the second trench to form a first single diffusion break (SDB) structure and a second SDB structure, and then forming a gate structure on the fin-shaped structure, the first SDB structure, and the second SDB structure.

According to another aspect of the present invention, a semiconductor device includes a fin-shaped structure on a substrate, a first single diffusion break (SDB) structure and a second SDB structure in the substrate, and a gate structure on the fin-shaped structure, the first SDB structure, and the second SDB structure. Preferably, each of the first SDB structure and the second SDB structure includes a bottom portion and a top portion and the bottom portion and the top portion are made of different materials.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
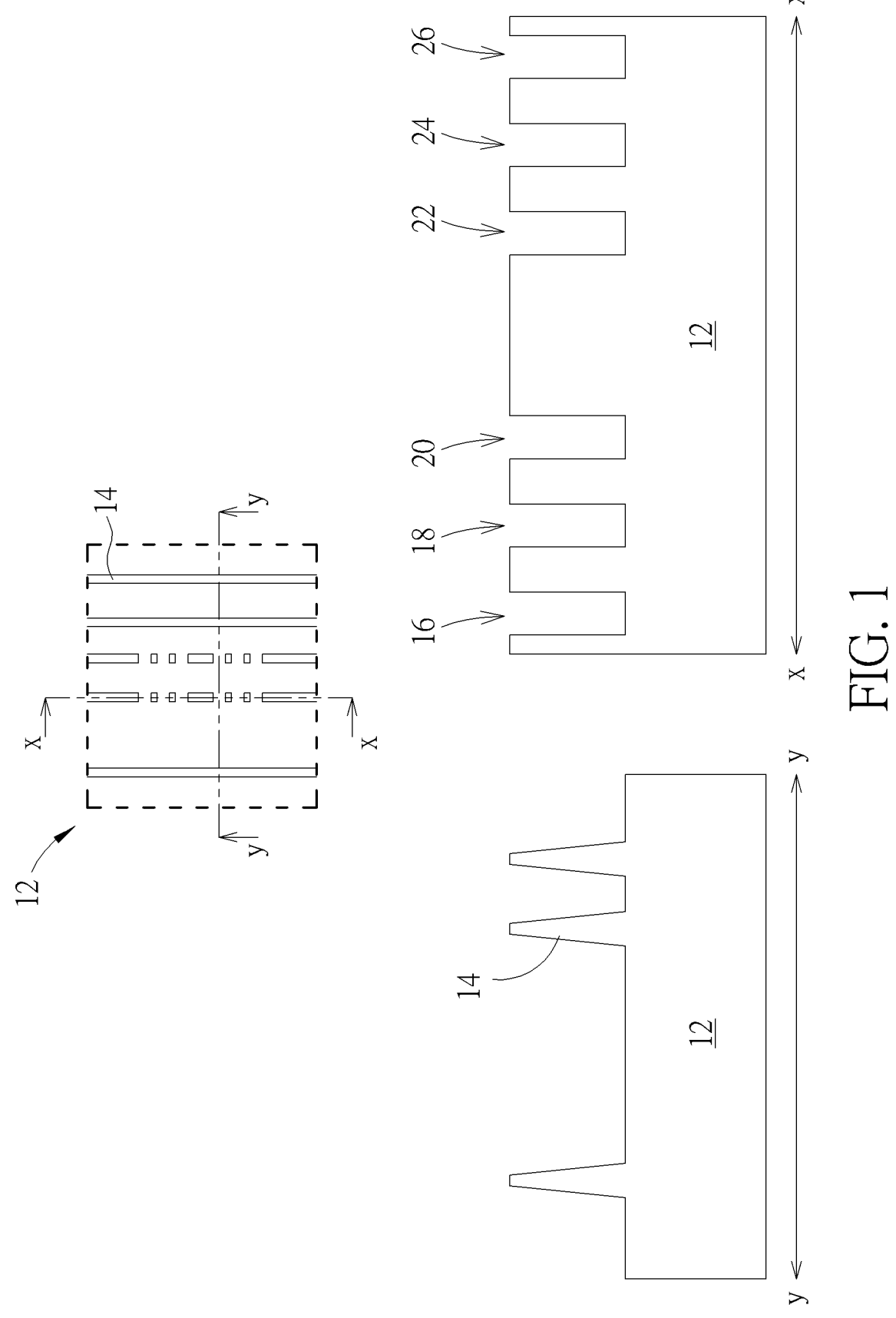
FIGS. 1-5 illustrate a method for fabricating a semiconductor device according to an embodiment of the present invention.

Referring to FIGS. 1-5, FIGS. 1-5 illustrate a method for fabricating a semiconductor device or more specifically an approach of fabricating a HV device under 17 nm technology node according to an embodiment of the present invention. First referring to FIG. 1, in which the top portion of FIG. 1 illustrates a top view for fabricating a semiconductor device according to an embodiment of the present invention, the lower left portion of FIG. 1 illustrates a cross-section view of the top portion taken along the sectional line YY', and the lower right portion of FIG. 1 illustrates a cross-section view of the top portion taken along the sectional line XX'. As shown in FIG. 1, a substrate 12, such as a silicon substrate or silicon-on-insulator (SOI) substrate is first provided and at least fin-shaped structure 14 is formed on the substrate 12. It should be noted that even though five fin-shaped structures 14 are disposed on the substrate 12 in this embodiment, it would also be desirable to adjust the number of fin-shaped structures 14 depending on the demand of the product, which is also within the scope of the present invention.

Preferably, the fin-shaped structures 14 of this embodiment could be obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the fin-shaped structures 14 could also be obtained by first forming a patterned mask (not shown) on the substrate, 12, and through an etching process, the pattern of the patterned mask is transferred to the substrate 12 to form the fin-shaped structures 14. Moreover, the formation of the fin-shaped structures 14 could also be accomplished by first forming a patterned hard mask (not shown) on the substrate 12, and a semiconductor layer composed of material such as silicon germanium is grown from the substrate 12 through exposed patterned hard mask via selective epitaxial growth process to form the corresponding fin-shaped structures 14. These approaches for forming fin-shaped structure are all within the scope of the present invention. It should be noted that after the fin-shaped structures 14 are formed, a liner (not shown) made of silicon oxide could be formed on the surface of the fin-shaped structures 14.

Next, a fin remove process is conducted to remove part of the fin-shaped structures 14. For instance, the fin remove process could be accomplished by removing part of the second and third fin-shaped structures 14 counting from the left of the top view to form trenches such as six trenches 16, 18, 20, 22, 24, 26 in the substrate 12, in which the trenches, 16, 18, 20, 22, 24, 26 divide the second and third fin-shaped structures 14 into multiple portions. As shown in the lower left and lower right portions of FIG. 1, the depth of each of the trenches 16, 18, 20, 22, 24, 26 is preferably between 1000-1400 Angstroms or most preferably at 1200 Angstroms, but not limited thereto. It should be noted the fin-shaped structures 14 shown in FIG. 1 is only a partial illustration of the structure such that even though the fin-shaped structures 14 may seem to be independent while not contacting each other, the head and tail portion of the fin-shaped structures 14 at this stage are still in fact connected to adjacent fin-shaped structures 14 so that each of the fin-shaped structures 14 would reveal a ring shape if viewed from a top view perspective.

Figure 2:
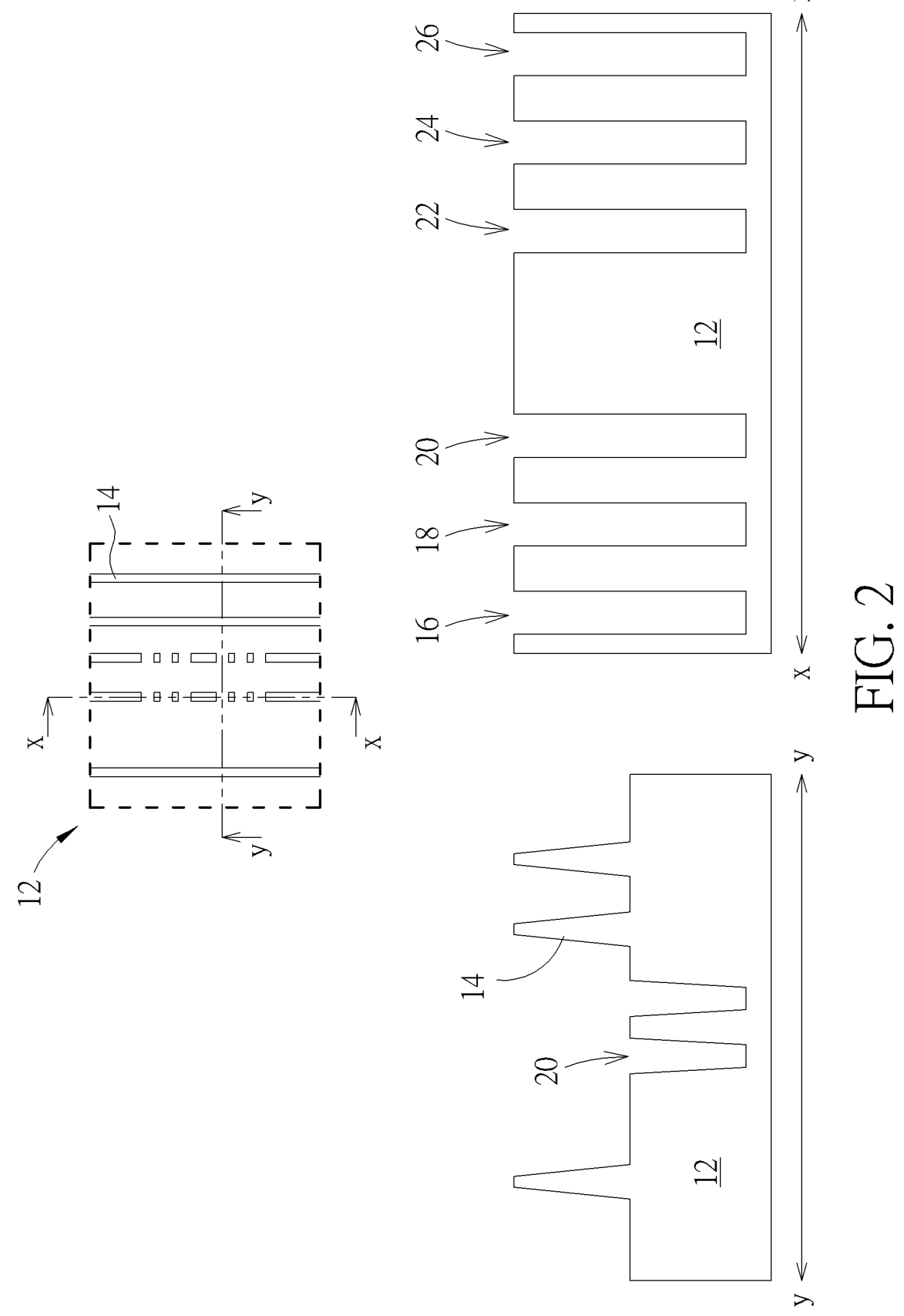

Next, as shown in FIG. 2, a fin cut process is conducted to divide the ring-shaped fin-shaped structures 14 into separate and independent stripe patterns. As shown in the lower left portion and lower right portion of FIG. 2, the etching process conducted in the fin cut process preferably removes part of the substrate 12 once more in particular to further extend the depth of the trenches 16, 18, 20, 22, 24, 26 so that the depth of the trenches 16, 18, 20, 22, 24, 26 shown on the lower right portion at this stage is preferably extended to 2000-2800 Angstroms or most preferably 2400 Angstroms.

Figure 3:
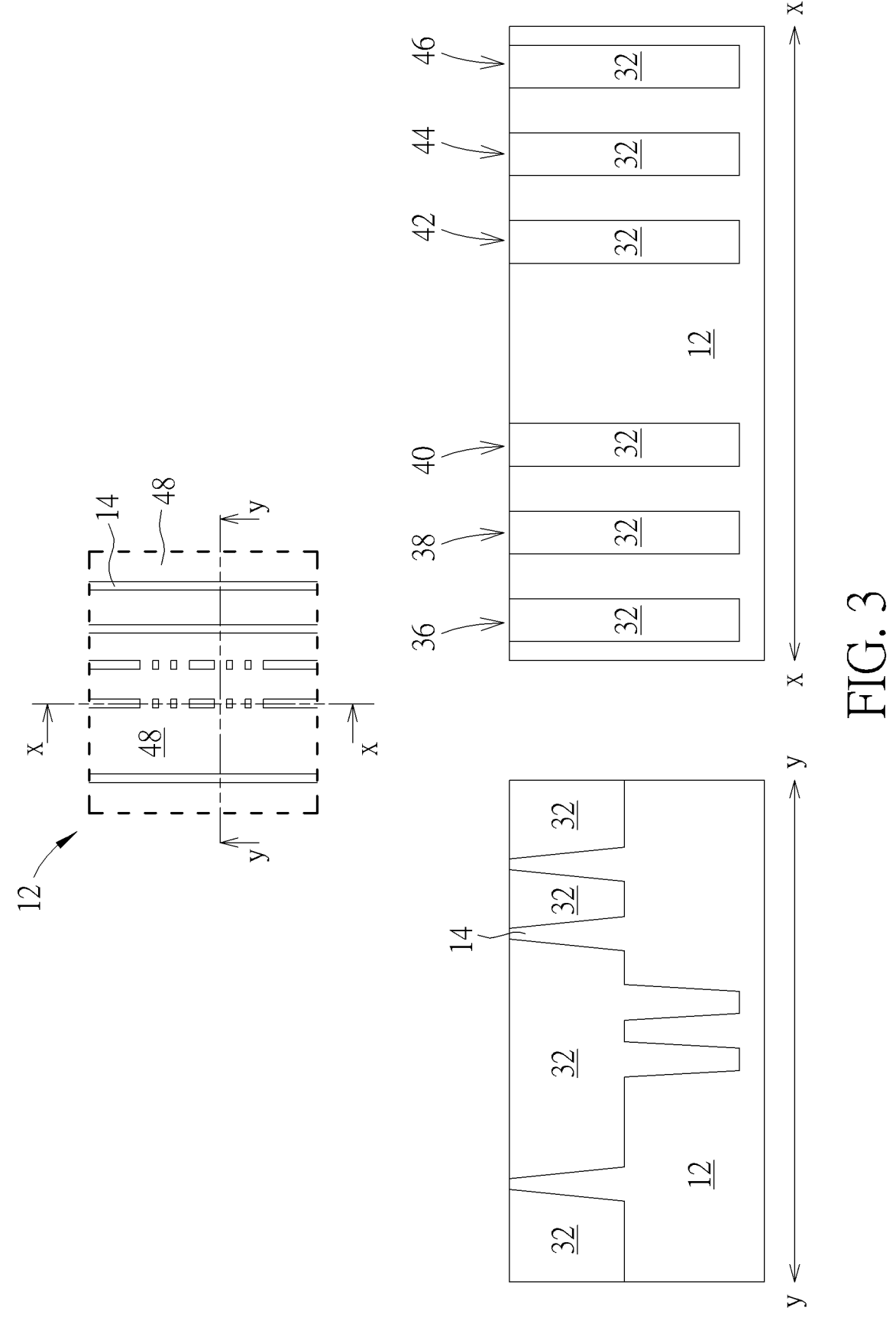

Next, as shown in FIG. 3, a dielectric layer 32 is formed to fill the trenches 16, 18, 20, 22, 24, 26 completely, and then a planarizing process such as a chemical mechanical polishing (CMP) process and/or an etching process is conducted to remove part of the dielectric layer 32 so that the top surface of the remaining dielectric layer 32 is even with or slightly higher than the top surface of the fin-shaped structures 14. It should be noted that the dielectric layer 32 filled into the trenches 16, 18, 20, 22, 24, 26 preferably forms single diffusion break (SDB) structures 36, 38, 40, 42, 44, 46 between the divided fin-shaped structures 14 and at the same time forms a shallow trench isolation (STI) 48 around the fin-shaped structures 14. For clarity purpose, the dielectric layer 32 filled into the trenches 16, 18, 20, 22, 24, 26 for dividing the fin-shaped structure 14 into multiple portions preferably becomes the SDB structures 36, 38, 40, 42, 44, 46 while the dielectric layer 32 filled between adjacent fin-shaped structures 14 becomes the STI 48. In this embodiment, the dielectric layer 32 is preferably made of silicon oxide, but not limited thereto.

Figure 4:
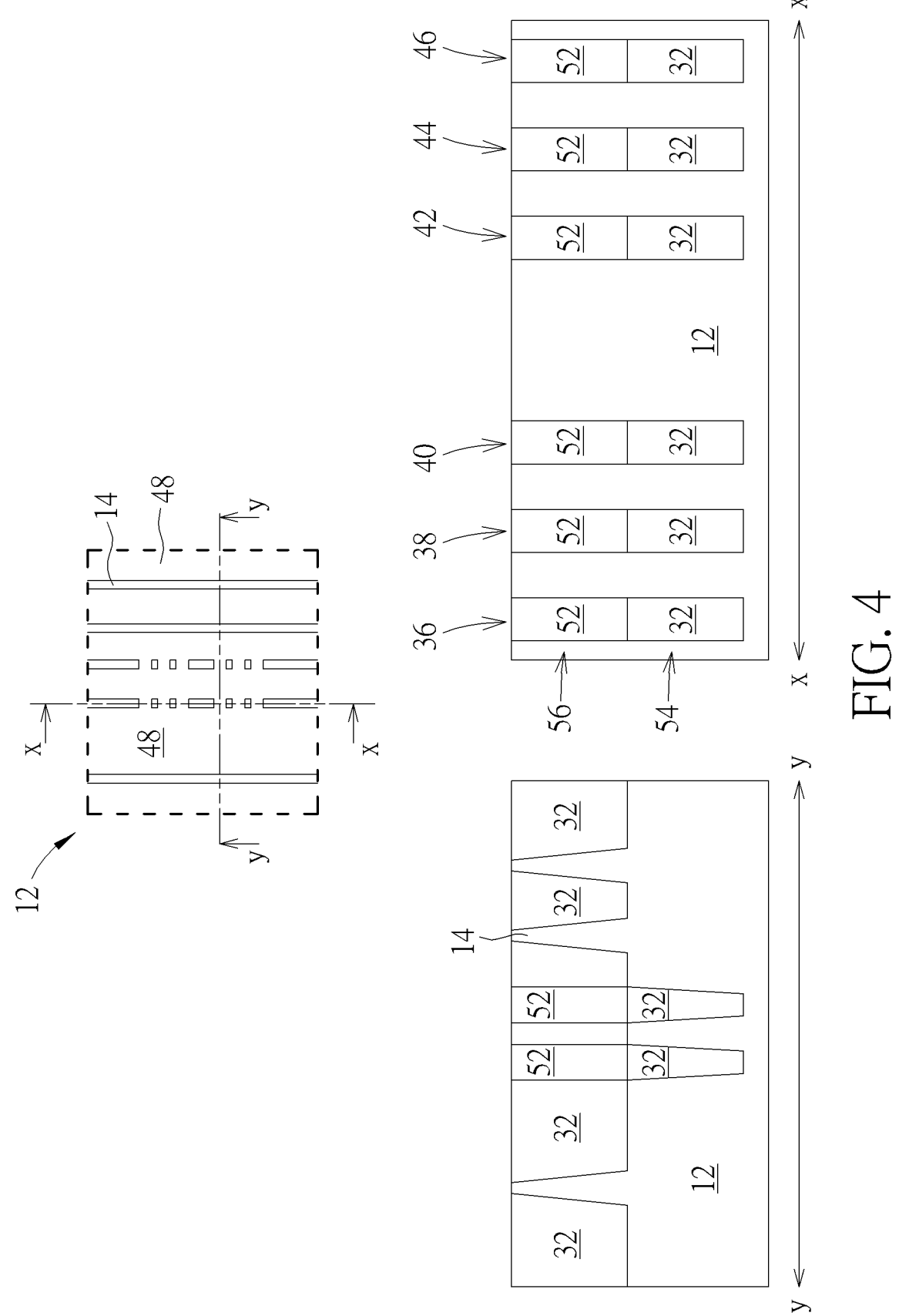

Next, as shown in FIG. 4, a photo-etching process is conducted by using the patterned mask used during the aforementioned fin cut process to remove part of the dielectric layer 32 filled in the trenches 16, 18, 20, 22, 24, 26 for forming trenches (not shown) above the filled dielectric layer 32, and then another dielectric layer 52 is formed to fill the newly formed trenches and a planarizing process such as CMP is conducted to remove a part of the dielectric layer 52 so that the top surface of the remaining dielectric layer 52 is even with the top surface of the fin-shaped structure 14. In other word, each of the SDB structures 36, 38, 40, 42, 44, 46 that originally made of a single material is now made of two different materials, in which the bottom portion 54 is preferably made of silicon oxide while the top portion 56 is made of silicon nitride. In this embodiment, the bottom portions 54 and the top portions 56 could have same or different depths. For instance, the depth of each of the bottom portions 54 is preferably between 1000-1400 Angstroms or most preferably 1200 Angstroms while the depth of each of the top portions 56 is also between 1000-1400 Angstroms or most preferably 1200 Angstroms, but not limited thereto.

Figure 5:
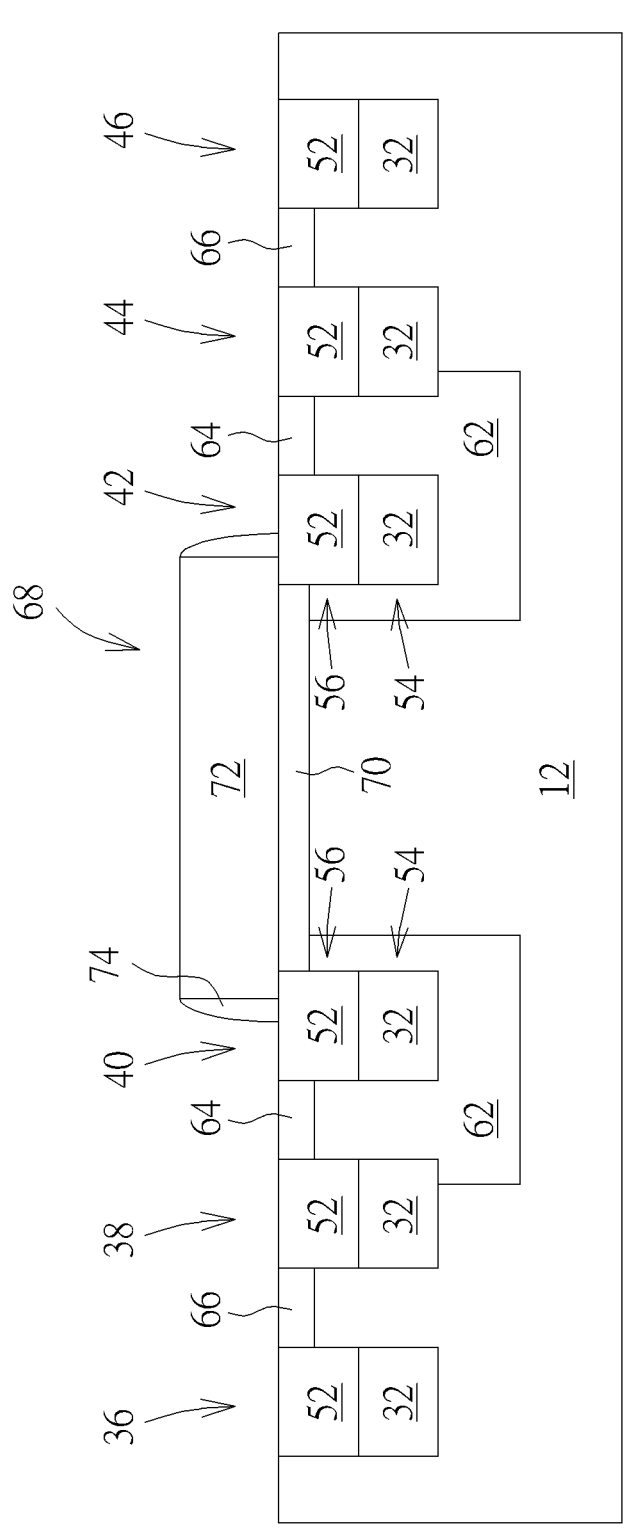

Referring to FIG. 5, FIG. 5 illustrates a structural view of a HV device fabricated by following the aforementioned processes. It should be noted that in order to combine other transistor elements around the SDB structures 36, 38, 40, 42, 44, 46, the width and depth ratio of the SDB structures 36, 38, 40, 42, 44, 46 have been slightly adjusted in the embodiments disclosed thereafter. As shown in FIG. 5, it would then be desirable to first form a well region such as p-well 62 between the SDB structures 38, 40 and the SDB structures 42, 44, form doped regions such as p+ regions 64 between the SDB structures 38, 40 and the SDB structures 42, 44, form doped regions such as n+ regions 66 between the SDB structures 36, 38 and the SDB structures 44, 46, form a gate structure 68 between the SDB structures 40, 42 while standing on the substrate 12 and the SDB structures 40, 42, and then form a spacer 74 made of silicon oxide and/or silicon nitride on sidewalls of the gate structure 68.

In this embodiment, the gate structure 68 could include a gate dielectric layer 70 made of silicon oxide and a gate electrode 72 made of polysilicon or metal, in which the gate dielectric layer 70 preferably contacts the substrate 12 and the SDB structures 40, 42 directly. If the gate electrode 72 in the gate structure 68 were made of metal, the gate electrode 72 could further include typical metal gate elements such as a high-k dielectric layer, a work function metal layer, and a low resistance layer. Since the fabrication of a polysilicon gate or metal gate is well known to those skilled in the art, the details of which are not explained herein for the sake of brevity.

Figure 6:
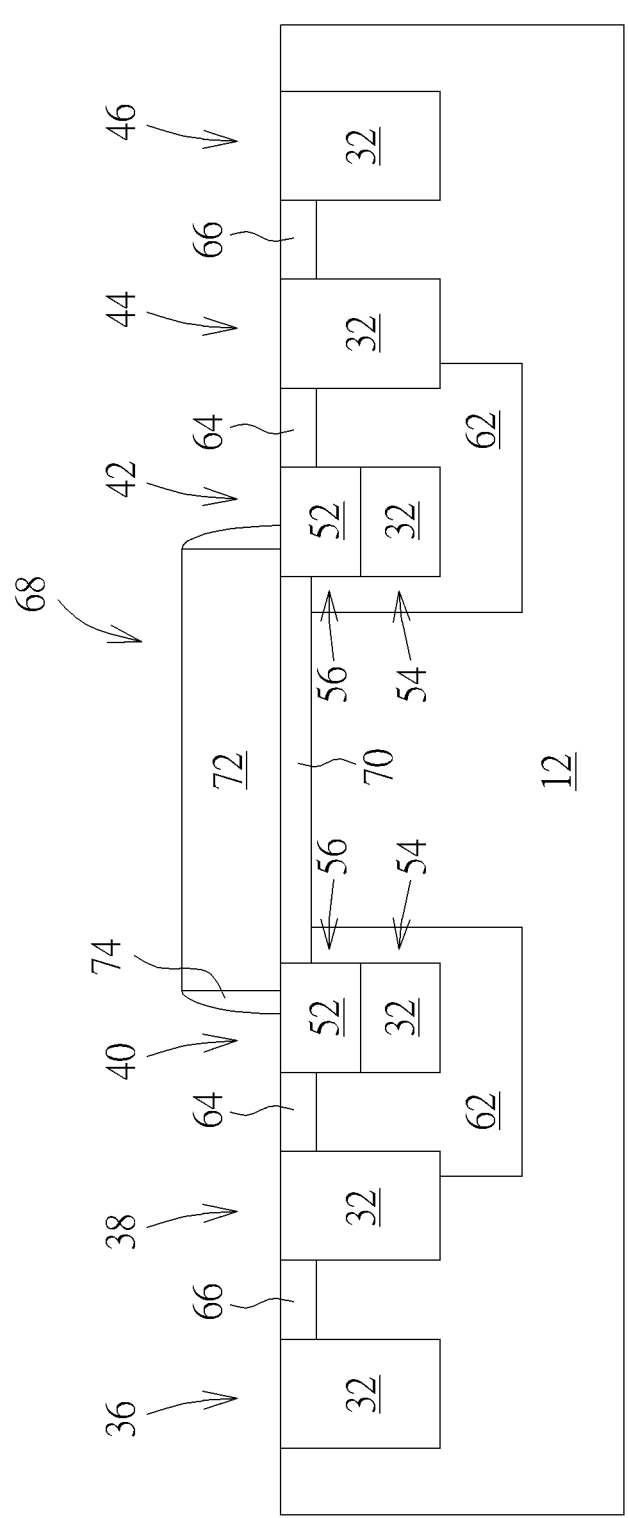
FIG. 6 illustrates a structural view of a HV device according to an embodiment of the present invention.

Referring to FIG. 6, FIG. 6 illustrates a structural view of a HV device according to an embodiment of the present invention. As shown in FIG. 6, in contrast to the bottom portions 54 and top portions 56 of all six SDB structures 36, 38, 40, 42, 44, 46 are made of different materials as shown in the embodiment of FIG. 5, it would also be desirable to convert the two SDB structures 40, 42 immediately adjacent to two sides of the gate structure 68 into SDB structures 40, 42 made of two different materials while the remaining four SDB structures 36, 38, 44, 46 are made of a single material during the processes conducted in FIGS. 3-4. In other words, it would be desirable to first follow the steps shown in FIGS. 1-3 by forming a dielectric layer 32 into the trenches 16, 18, 20, 22, 24, 26, removing part of the dielectric layer 32 in the trenches 20, 22 but not removing the dielectric layer 32 in the trenches 16, 18, 24, 26, and then depositing another dielectric layer 52 into the trenches 20, 22. By doing so, all six SDB structures 36, 38, 40, 42, 44, 46 would have same depths while only the two SDB structures 40, 42 immediately adjacent to two sides of the gate structure 68 would include a bottom portion 54 and a top portion 56 made of different materials. The material of the remaining SDB structures 36, 38, 44, 46 is preferably the same as the bottom portions 54 of the SDB structures 40, 42 such as the dielectric layer 32.

Figure 7:
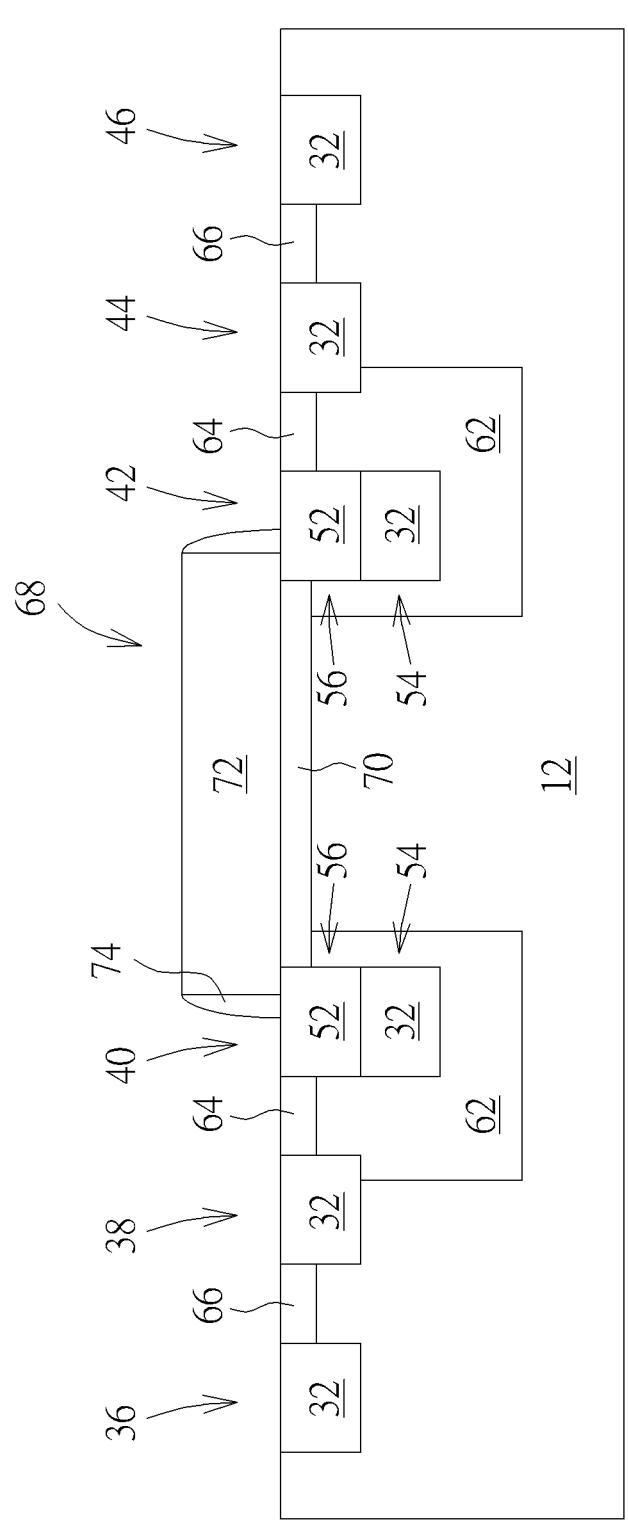
FIG. 7 illustrates a structural view of a HV device according to an embodiment of the present invention.

Referring to FIG. 7, FIG. 7 illustrates a structural view of a HV device according to an embodiment of the present invention. As shown in FIG. 7, in contrast to all six SDB structures 36, 38, 40, 42, 44, 46 shown in FIGS. 4-5 have same depths, it would also be desirable to adjust the depths of the SDB structures 36, 38, 40, 42, 44, 46 so that the depth of the SDB structures 40, 42 immediately adjacent to and directly contacting the gate structure 68 is slightly greater than the depth of the other four SDB structures 36, 38, 44, 46, in which the depth of the SDB structures 36, 38, 44, 46 is preferably half of the SDB structures 40, 42. Similar to the embodiment shown in FIG. 6, only the SDB structures 40, 42 immediately adjacent to two sides of the gate structure 68 in this embodiment include bottom and top portions made of different materials while the remaining four SDB structures 36, 38, 44, 46 adjacent to two sides but not directly contacting the gate structure 68 are made of a single material. Similarly, the material of the SDB structures 36, 38, 44, 46 is preferably the same as the bottom portions 54 of the SDB structures 40, 42.

Figure 8:
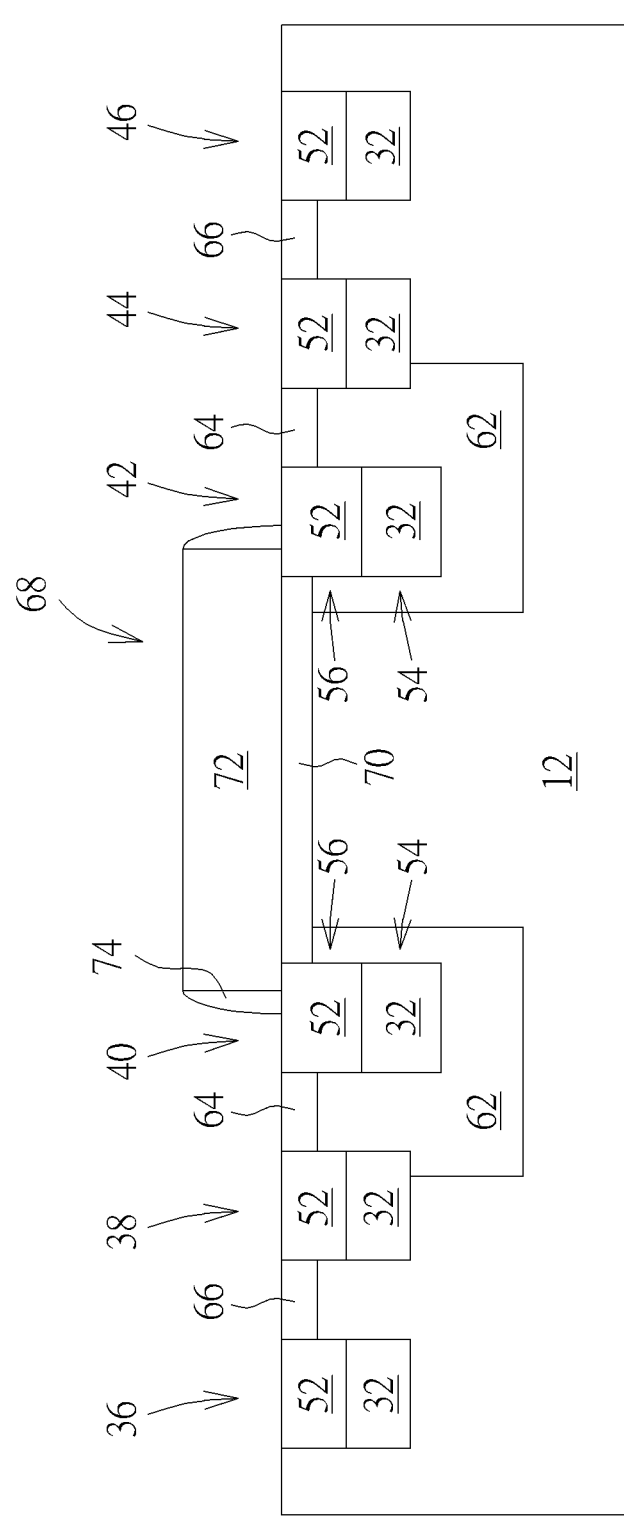
FIG. 8 illustrates a structural view of a HV device according to an embodiment of the present invention.

Referring to FIG. 8, FIG. 8 illustrates a structural view of a HV device according to an embodiment of the present invention. As shown in FIG. 8, it would be desirable to combine the embodiments shown in FIGS. 5 and 7 by first forming six trenches in the substrate 12 while the depth of the two trenches immediately adjacent to two sides of the gate structure 68 is greater than the depth of the other four trenches, and then follow the processes conducted in FIGS. 3-5 by depositing different dielectric materials into each of the trenches for forming the SB structures 36, 38, 40, 42, 44, 46. In this embodiment, the bottom portion 54 and the top portion 56 in each of the six SDB structures 36, 38, 40, 42, 44, 46 are made of different materials. Nevertheless, in contrast to all six SDB structures 36, 38, 40, 42, 44, 46 in FIG. 5 share same depth, the depth of the SDB structures 40, 42 immediately adjacent to two sides of the gate structure 68 is greater than the depth of the other SDB structures 36, 38, 44, 46. Preferably, the depth of the SDB structures 36, 38, 44, 46 could be 90%, 80%, 70%, 60%, 50% of the depth of the SDB structures 40, 42 or even less than half the depth of the SDB structures 40, 42, which are all within the of the present invention.

Overall, the present invention discloses an approach of integrating SDB structures to a HV device, which first forms fin-shaped structure on a substrate, conducts an etching process to remove part of the fin-shaped structures for forming a plurality of trenches and at the same time dividing the fin-shaped structures into sub-portions, deposits a first type of dielectric material into the trenches for SDB structures, removes part of the first type of dielectric material, forms a second type of dielectric material on the first type of dielectric material, and then forms transistor elements such as a gate structure and doped regions. Preferably, the gate structures is disposed on the fin-shaped structure while standing on two SDB structures 40, 42 directly, in which each of the SDB structures includes a bottom portion and a top portion made of different materials. By using this approach to fabricating HV devices under 17 nm technology node, it would be desirable to improve overall stability and performance of the device substantially.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
a fin-shaped structure on a substrate;
a first single diffusion break (SDB) structure and a second SDB structure in the substrate, wherein each of the first SDB structure and the second SDB structure comprises a bottom portion and a top portion, the bottom portion and the top portion comprise different materials, and top surfaces of the top portion and the substrate are coplanar; and
a gate structure on the fin-shaped structure, the first SDB structure, and the second SDB structure.

2. The semiconductor device of claim 1, further comprising:
a third SDB structure and a fourth SDB structure adjacent to two sides of the first SDB structure and the second SDB structure, wherein each of the third SDB structure and the fourth SDB structure comprises the bottom portion and the top portion and the bottom portion and the top portion comprise different materials.

3. The semiconductor device of claim 2, further comprising a fifth SDB structure and a sixth SDB structure adjacent to two sides of the third SDB structure and the fourth SDB structure.

4. The semiconductor device of claim 2, wherein a depth of the first SDB structure is greater than a depth of the third SDB structure.

5. The semiconductor device of claim 1, further comprising:
a third SDB structure and a fourth SDB structure adjacent to two sides of the first SDB structure and the second SDB structure, wherein each of the third SDB structure and the fourth SDB structure comprises a single material.

6. The semiconductor device of claim 5, further comprising a fifth SDB structure and a sixth SDB structure adjacent to two sides of the third SDB structure and the fourth SDB structure.

7. The semiconductor device of claim 5, wherein a depth of the first SDB structure is greater than a depth of the third SDB structure.

8. The semiconductor device of claim 1, wherein the bottom portion comprises silicon oxide.

9. The semiconductor device of claim 1, wherein the top portion comprises silicon nitride.

* * * * *